United States Patent
Nam et al.

(10) Patent No.: US 9,510,440 B2
(45) Date of Patent: Nov. 29, 2016

(54) DISPLAY DEVICE AND CURVATURE VARIATION DEVICE ADAPTED THERETO

(71) Applicant: Samsung Display Co., LTD., Yongin, Gyeonggi-Do (KR)

(72) Inventors: Yun-Ha Nam, Asan-si (KR); Dong-Sung Im, Asan-si (KR)

(73) Assignee: SAMSUNG DISPLAY CO., LTD. (KR)

( * ) Notice: Subject to any disclaimer, the term of this patent is extended or adjusted under 35 U.S.C. 154(b) by 279 days.

(21) Appl. No.: 14/308,836

(22) Filed: Jun. 19, 2014

(65) Prior Publication Data

US 2015/0223358 A1    Aug. 6, 2015

(30) Foreign Application Priority Data

Feb. 4, 2014    (KR) ........................ 10-2014-0012657

(51) Int. Cl.
  *H05K 5/02*    (2006.01)
  *H05K 7/18*    (2006.01)
  *H05K 1/02*    (2006.01)
  *G06F 1/16*    (2006.01)
  *G09G 3/00*    (2006.01)

(52) U.S. Cl.
  CPC .............. *H05K 1/028* (2013.01); *G06F 1/1652* (2013.01); *Y10T 74/1892* (2015.01)

(58) Field of Classification Search
  CPC ............ H05K 5/02; H05K 7/18; H05K 7/14; H05K 5/0217; H05K 1/028; H05K 5/0017; H05K 7/183; G09G 3/00
  USPC ......................................................... 361/749
  See application file for complete search history.

(56) References Cited

U.S. PATENT DOCUMENTS

| | | | |
|---|---|---|---|
| 6,215,593 B1 | 4/2001 | Bruce | |
| 8,547,197 B2 | 10/2013 | Byun et al. | |
| 2010/0171708 A1 | 7/2010 | Chuang | |
| 2012/0262367 A1 | 10/2012 | Chiu et al. | |
| 2013/0100053 A1 | 4/2013 | Kang et al. | |
| 2013/0114193 A1* | 5/2013 | Joo | F16M 11/08 361/679.01 |
| 2013/0155052 A1 | 6/2013 | Ko | |
| 2013/0162556 A1 | 6/2013 | Yu | |
| 2013/0207946 A1 | 8/2013 | Kim et al. | |
| 2015/0009635 A1* | 1/2015 | Kang | G09F 9/301 361/749 |

FOREIGN PATENT DOCUMENTS

| | | |
|---|---|---|
| KR | 10-0711884 B1 | 4/2007 |
| KR | 1020130099664 A | 9/2013 |

* cited by examiner

*Primary Examiner* — Eric Thomas
*Assistant Examiner* — Michael P McFadden
(74) *Attorney, Agent, or Firm* — Cantor Colburn LLP

(57) ABSTRACT

A display device includes a flexible display substrate and a curvature variation device. The curvature variation device is disposed on a rear surface of the flexible display substrate. A length of the curvature variation device is varied in response to an operation of a user to the curvature variation device, to vary a curvature of the flexible display substrate.

13 Claims, 14 Drawing Sheets

DISPLAY DEVICE AND CURVATURE VARIATION DEVICE ADAPTED THERETO

This application claims priority to Korean Patent Application No. 10-2014-0012657, filed on Feb. 4, 2014, and all the benefits accruing therefrom under 35 U.S.C. §119, the contents of which are herein incorporated by reference in their entirety.

BACKGROUND (1) Field

Exemplary embodiments of the invention relate to a display device and a curvature variation device adapted to the display device. More particularly, exemplary embodiments of the invention relate to a display device having a varying curvature and a curvature variation device adapted to the display device.

(2) Description of the Related Art

Generally, a field of view of a flat display device such as a liquid crystal display ("LCD") or a plasma display panel ("PDP") has a certain range. Therefore, a user cannot see images, etc. displayed on a screen of the flat display device from a location beyond the range of the field of view.

To address this problem, a rotating apparatus that can rotate the flat display device by a predetermined angle corresponding to a location of the user has been provided as a peripheral device of the flat display device. For example, the rotating apparatus may include an electric stand that is used to rotate the flat display device installed on a stand and an electric wall that is used to rotate the flat display device installed on a wall mount.

However, when the flat display device is installed adjacent to a wall, the rotating apparatus has a problem that a rotating angle by which the rotating apparatus can rotate the flat display device is limited by a distance between the wall and the flat display device.

However, increasing the distance between the flat display device and the wall in order to expand the rotation range of the flat display device occupies a relatively large amount of space when installing the flat display device and such installation is inefficient.

Therefore, there remains a need for an improved flexible display device that can bend a portion of a screen toward a user who is beyond a field of view so that the user can see images displayed on the screen of the flexible display device even when the user is beyond the rotation range of a conventional rotating apparatus.

Moreover, a display device that can achieve a curvature radius in accordance with a distance between a user and a flexible display device is desired.

SUMMARY

Exemplary embodiments of the invention provide a display device having a varying curvature of a flexible display substrate.

Exemplary embodiments of the invention also provide a curvature variation device adapted to the above-mentioned display device.

According to an exemplary embodiment, a display device includes a flexible display substrate and a curvature variation device. The curvature variation device is on a rear surface of the flexible display substrate. A length of the curvature variation device is configured to be varied in response to user input to the curvature variation device, and variation of the length of the curvature variation device in response to the user input to the curvature variation device varies a curvature of the flexible display substrate.

In an exemplary embodiment, the flexible display substrate may further include a guide recess defined in a rear surface thereof. The curvature variation device may include a substrate contact member and a length variation member. The substrate contact member is received in the guide recess and contacts the rear surface of the flexible display substrate. The length variation member is supported by the substrate contact member. A length of the length variation member may be varied in response to the operation of the user to vary the curvature of the flexible display substrate.

In an exemplary embodiment, the curvature variation device may include a rail, a substrate contact member and a length variation member. The rail contacts a rear surface of the flexible display substrate. The substrate contact member is received in a guide recess defined in the rail and contacts the rear surface of the flexible display substrate. A length variation member is supported by the substrate contact member. A length of the length variation member is varied in response to the operation of the user to vary the curvature of the flexible display substrate.

In an exemplary embodiment, the curvature variation device may be parallel with a curvature surface of the flexible display substrate.

In an exemplary embodiment, the curvature of the flexible display substrate may define a flat status or a curved status of the flexible display substrate.

In an exemplary embodiment, the curvature of the flexible display substrate may be symmetrically varied by the curvature variation device.

In an exemplary embodiment, the curvature of the flexible display substrate may be asymmetrically varied by the curvature variation device.

According to another exemplary embodiment, a curvature variation device is on a rear surface of a flexible display substrate to vary a curvature of the flexible display substrate in response to an operation of a user. The curvature variation device includes a substrate contact member and a length variation member. The substrate contact member is received in a guide recess defined in the rear surface of the flexible display substrate and contacts the rear surface of the flexible display substrate. The length variation member is supported by the substrate contact member. A length of the length variation member is varied in response to the operation of the user to vary the curvature of the flexible display substrate.

In an exemplary embodiment, the substrate contact member may include a spring.

According to another exemplary embodiment, a curvature variation device is on a rear surface of a flexible display substrate to vary a curvature of the flexible display substrate in response to an operation of a user. The curvature variation device includes a rail, a substrate contact member and a length variation member. The rail contacts to the rear surface of the flexible display substrate. The substrate contact member is received in a guide recess defined in the rail and contacts the rear surface of the flexible display substrate. The length variation member is supported by the substrate contact member. A length of the length variation member is varied in response to the operation of the user to vary the curvature of the flexible display substrate.

In an exemplary embodiment, the substrate contact member may include a first stopper, a second stopper and a stopper control box. The first stopper is received in the guide recess defined in the rail to have a length varied along a first side of the rail. The second stopper is received in the guide recess to have a length varied along a second side of the rail. The stopper control box is respectively connected to the first stopper and the second stopper to control a length variation of the first stopper and a length variation of the second stopper.

In an exemplary embodiment, each of the first stopper and the second stopper may include a penetration wire and a core wire. The penetration wire has plural wire bundles interlaced to form a penetrated inner space. The core wire has plural wire bundles interlaced and is received on the penetrated inner space of the penetration wire.

In an exemplary embodiment, the length variation member may include a first multiple rod, a second multiple rod and a multiple rod control box. The first multiple rod is connected to an end portion of the first stopper and the second multiple rod is connected to an end portion of the second stopper. The multiple rod control box is respectively connected to the first multiple rod and the second multiple rod to control a length variation of the first multiple rod and a length variation of the second multiple rod.

According to one or more exemplary embodiment of a display device and a curvature variation device adapted to the display device, a curvature variation device is disposed on a rear surface of a flexible display device and lengths of multiple rods of the curvature variation device are varied, so that the variation in length of the multiple rods may vary a curvature of the flexible display substrate.

BRIEF DESCRIPTION OF THE DRAWINGS

The above and other features of the invention will become more apparent by describing in detailed exemplary embodiments thereof with reference to the accompanying drawings, in which.

DETAILED DESCRIPTION

Figure 1A:
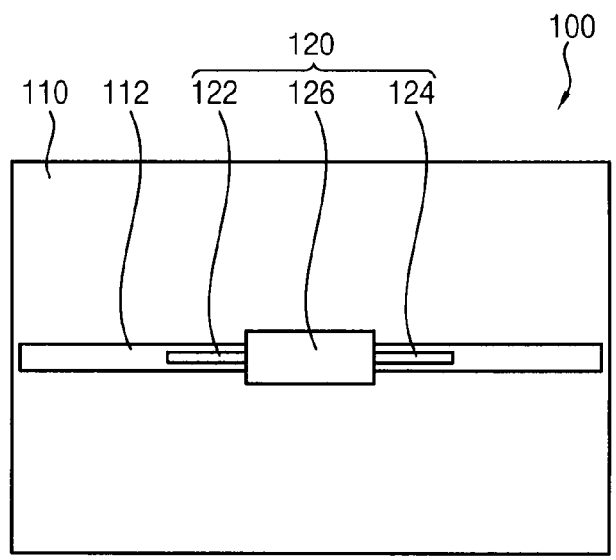
FIG. 1A is a rear view schematically showing an exemplary embodiment of a display device according to the invention.
Figure 1A:
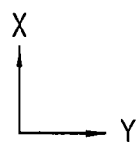

The invention is described more fully hereinafter with reference to the accompanying drawings, in which exemplary embodiments of the invention are shown. This invention may, however, be embodied in many different forms and should not be construed as limited to the exemplary embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on," "connected to" or "coupled to" another element or layer, the element or layer can be directly on, connected or coupled to another element or layer or intervening elements or layers. In contrast, when an element is referred to as being "directly on," "directly connected to" or "directly coupled to" another element or layer, there are no intervening elements or layers present. As used herein, connected may refer to elements being physically and/or electrically connected to each other. Like numbers refer to like elements throughout. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the invention.

Spatially relative terms, such as "lower," "under," "above," "upper" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "lower" relative to other elements or features would then be oriented "upper" relative to the other elements or features. Thus, the exemplary term "under" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used in this specification, specify the presence of stated features, integers, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, a display device and a curvature variation device adapted to the display device according to the invention will be explained in detail with reference to the accompanying drawings.

Figure 1B:
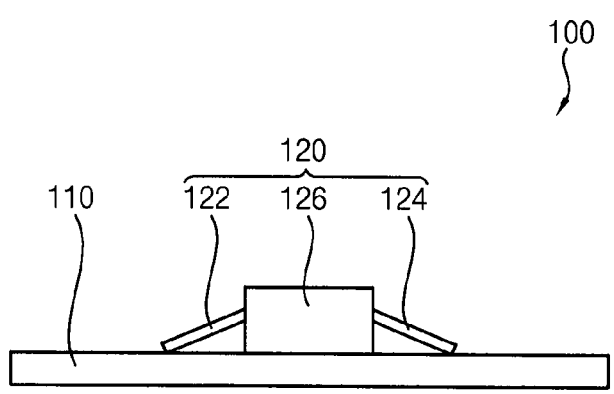
FIG. 1B is a side view schematically showing the display device in FIG. 1A.
Figure 1B:
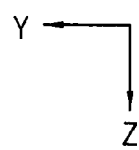
Figure 2A:
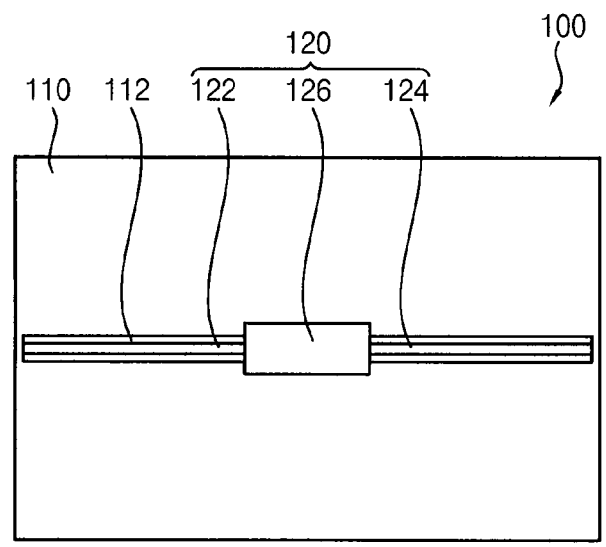
FIG. 2A is a rear view schematically showing an exemplary embodiment of a curved mode of the display device shown in FIG. 1A.
Figure 2A:
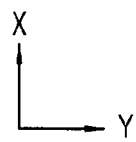
Figure 2B:
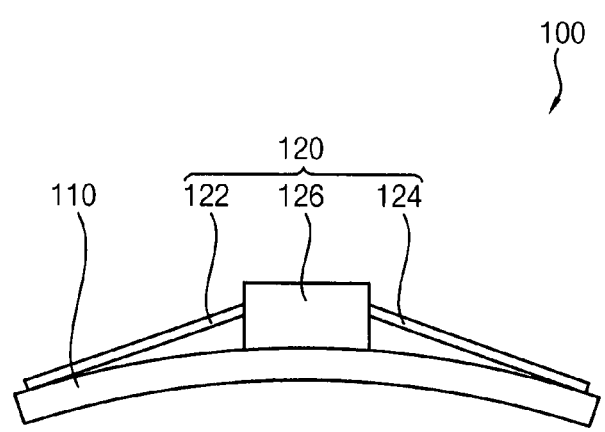
FIG. 2B is a side view schematically showing the display device in a curved mode in FIG. 2A.
Figure 2B:
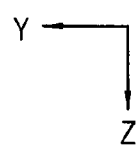

FIG. 1A is a rear view schematically showing an exemplary embodiment of a display device according to the invention. FIG. 1B is a side view schematically showing the display device shown in FIG. 1A. FIG. 2A is a rear view schematically showing an exemplary embodiment of a curved mode of the display device shown in FIG. 1A. FIG. 2B is a side view schematically showing the display device in the curved mode shown in FIG. 2A. Particularly, FIGS. 1A and 1B show a display device which is driven in a flat mode and FIGS. 2A and 2B show a display device which is driven in a curved mode.

Referring to FIGS. 1A, 1B, 2A and 2B, a display device 100 includes a flexible display substrate 110 and a curvature variation device 120. The flexible display substrate according to one or more exemplary embodiment of the invention may represent a flat display device such as a liquid crystal display ("LCD") or a plasma display panel ("PDP"), which is configured to display an image.

The flexible display substrate 110 includes a flexible material and is configured to display an image, and is variable from a flat mode (or state) to a curved mode (or state) or from a curved mode to a flat mode by an external force applied thereto.

The curvature variation device 120 is disposed on a rear surface of the flexible display substrate 110. The rear surface is opposite to a display side of the display device 100. A length of the curvature variation device 120 is varied in response to an operation or input from a input source external to the display device, such as a user input, so that the curvature variation device 120 may vary a curvature of the flexible display device 110, and consequently vary a curvature of the display device 100 including the flexible display device 110. The curvature variation device 120 may control the flexible display substrate 110 to be disposed in a flat mode or a curved mode.

The curvature variation device 120 includes a first (multiple) rod 122, a second (multiple) rod 124 and a (multiple) rod control box 126 respectively connected to the first multiple rod 122 and the second multiple rod 124. The multiple rod control box 126 controls a length variation of the first multiple rod 122 and a length variation of the second multiple rod 124.

A guide recess 112 is formed on a rear surface of the flexible display substrate 110 so as to receive a portion of the first multiple rod 122 and a portion of the second multiple rod 124. The guide recess 112 may be disposed parallel with a Y-axis direction. Alternatively, a rail having a guide recess defined therein may be disposed on a rear surface of the flexible display substrate 110 so as to receive a portion of the first multiple rod 122 and a portion of the second multiple rod 124. A description for the guide recess 112 defined in the rear surface of the flexible display substrate 110 or a description for an additional rail may be described later.

The multiple rod control box 126 controls a length of the first multiple rod 122 and a length of the second multiple rod 124 in response to an operation of a user. The operation of the user may be realized by an operation of a remote controller (not shown) of the user. That is, a user input to the curvature variation device 120 varies the length of the first multiple rod 122 and a length of the second multiple rod 124.

In an exemplary embodiment, for one example, the length of the first multiple rod 122 and the length of the second multiple rod 124 may be controlled by the multiple rod control box 126 to have the same length. In an exemplary embodiment, for another example, the length of the first multiple rod 122 and the length of the second multiple rod 124 may be controlled by the multiple rod control box 126 to have the different lengths. The lengths may be defined based on a same type of location, such as from the multiple rod control box 126.

When the length of the first multiple rod 122 is substantially equal to the length of the second multiple rod 124 with respect to the multiple rod control box 126, the flexible display substrate 110 may be curved to have a symmetric structure with respect to the multiple rod control box 126.

When the length of the first multiple rod 122 is greater or smaller than the length of the second multiple rod 124 with respect to the multiple rod control box 126, the flexible display substrate 110 may be curved to have an asymmetric structure with respect to the multiple rod control box 126.

Figure 3A:
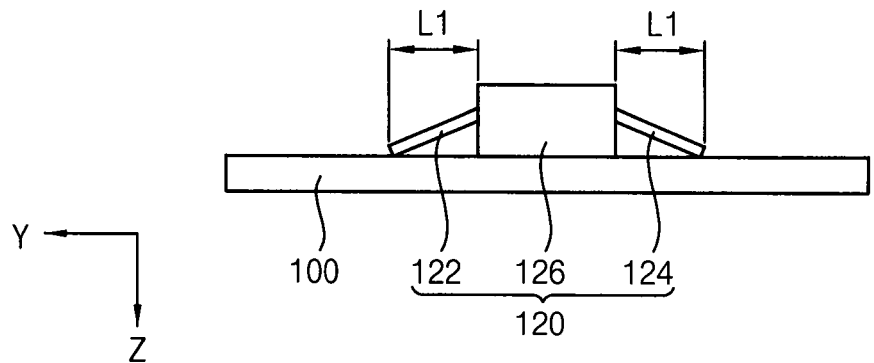
FIGS. 3A, 3B, 3C and 3D are side views schematically showing exemplary embodiments of operation modes of the display device shown in FIG. 1A.
Figure 3B:
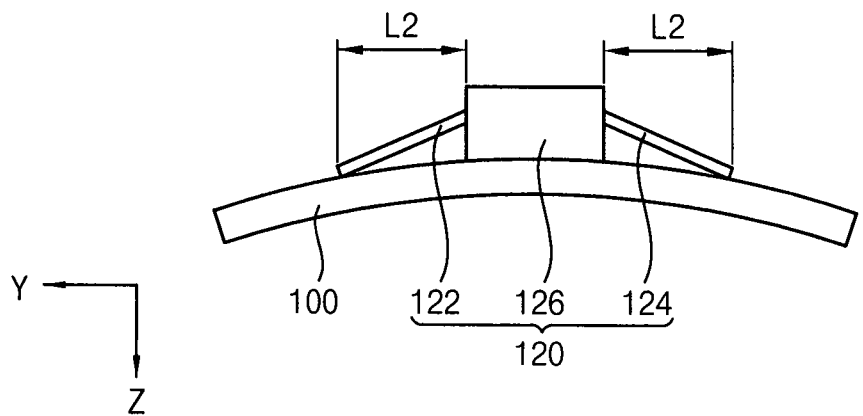
Figure 3C:
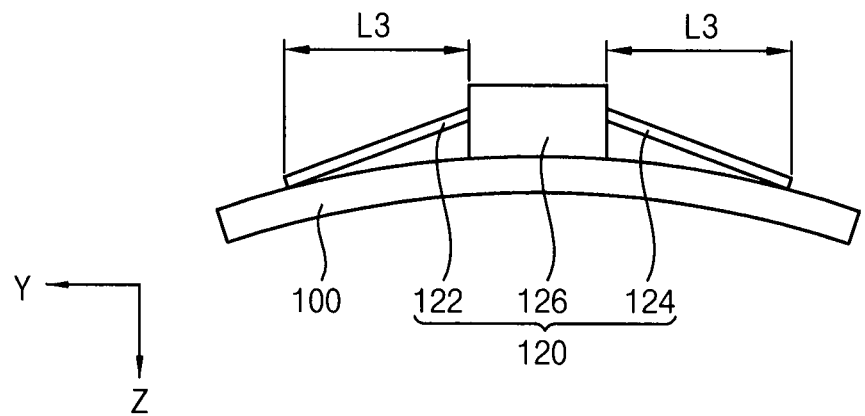
Figure 3D:
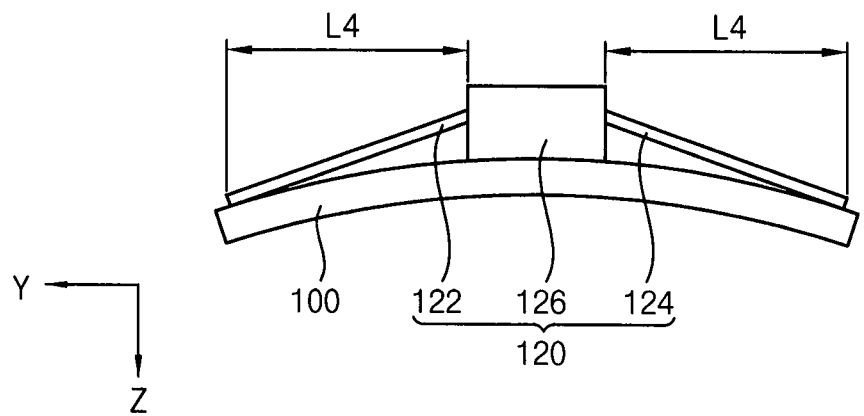

FIGS. 3A, 3B, 3C and 3D are side views schematically showing exemplary embodiments of operation modes of the display device shown in FIG. 1A. Particularly, FIG. 3A shows a display device operated as a flat mode, FIG. 3B shows a display device operated as a first curved mode having a first curvature radius, FIG. 3C shows a display device operated as a second curved mode having a second curvature radius, and FIG. 3D shows a display device operated as a third curved mode having a third curvature radius.

Referring to FIGS. 1A to 3D, when the multiple rod control box 126 controls lengths of the first multiple rod 122 and the second multiple rod 124 to be a first length L1, the flexible display substrate 110 may be operated in a flat mode (shown in FIG. 3A). In the flat mode, the flexible display substrate 110 is considered disposed on plane with the curvature variation device 120.

When the multiple rod control box 126 controls each length of the first multiple rod 122 and the second multiple rod 124 to be a second length L2 larger than the first length L1, the flexible display substrate 110 may be operated in a first curved mode having a first curvature radius (shown in FIG. 3B). In the first curved mode, portions of the flexible display substrate 110 are disposed at a distance from the plane of the curvature variation device 120 in the Z-axis direction.

When the multiple rod control box 126 controls each length of the first multiple rod 122 and the second multiple rod 124 to be a third length L3, the flexible display substrate 110 may be operated in a second curved mode having a second curvature radius (shown in FIG. 3C). In FIG. 3C, the second curvature radius may be smaller than the first curvature radius owing to the third length L3 being greater than the second length L2. In the second curved mode, portions of the flexible display substrate 110 are disposed at a further distance from the plane of the curvature variation device 120 in the Z-axis direction than in the first curved mode.

When the multiple rod control box 126 controls each length of the first multiple rod 122 and the second multiple rod 124 to be a fourth length L4, the flexible display substrate 110 may be operated in a third curved mode having a third curvature radius (shown in FIG. 3D). In FIG. 3D, the third curvature radius may be smaller than the second curvature radius owing to the fourth length L4 being greater than the third length L3. In the third curved mode, portions of the flexible display substrate 110 are disposed at even a further distance from the plane of the curvature variation device 120 in the Z-axis direction than in the second curved mode.

As described above, according to the illustrated exemplary embodiments, a curvature variation device is disposed on a rear surface of a flexible display device. In an exemplary embodiment, the curvature variation device includes a first multiple rod, a second multiple rod and a multiple rod control box. The multiple rod control box controls a length of the first multiple rod and a length of the second multiple rod in response to an operation of a user. Thus, lengths of multiple rods of the curvature variation device may be varied, thereby varying a curvature of a flexible display substrate.

Figure 4:
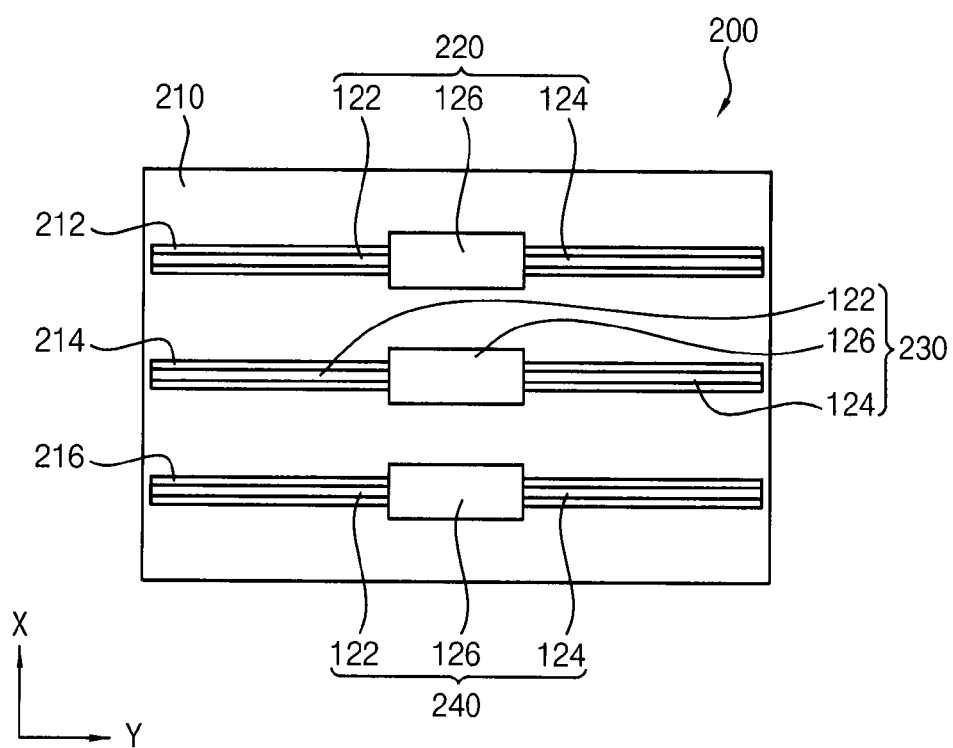
FIG. 4 is a rear view schematically showing another exemplary embodiment of a display device according to the invention.

FIG. 4 is a rear view schematically showing another exemplary embodiment of a display device according to the invention. Particularly, a display device including a curvature variation device which is configured in three curvature variation units is operated in a flat mode.

Referring to FIG. 4, a display device 200 includes a flexible display substrate 210, a first curvature variation unit 220, a second curvature variation unit 230 and a third curvature variation unit 240. In the exemplary embodiment, the first curvature variation unit 220, the second curvature variation unit 230 and the third curvature variation unit 240 may collectively define a curvature variation device of the display device 200.

The flexible display device 210 includes a flexible material and is configured to display an image, and is variable from a flat mode to a curved mode or from a curved mode to a flat mode by an external force applied thereto. A first guide recess 212, a second guide recess 214 and a third guide recess 216 are defined in a rear surface of the flexible display substrate 210. The first guide recess 212, the second guide recess 214 and the third guide recess 216 correspond to the first curvature variation unit 220, the second curvature variation unit 230 and the third curvature variation unit 240, respectively.

The first curvature variation unit 220, the second curvature variation unit 230 and the third curvature variation unit 240 are disposed on a rear surface of the flexible display substrate 210. Lengths of the first curvature variation unit 220, the second curvature variation unit 230 and the third curvature variation unit 240 are varied in response to an operation of a user, so that the first curvature variation unit 220, the second curvature variation unit 230 and the third curvature variation unit 240 vary a curvature of the flexible display device 210. The first curvature variation unit 220 may be disposed on an upper portion of a rear surface of the flexible display substrate 210 in the X-axis direction, the second curvature variation unit 230 may be disposed on a middle portion of the rear surface of the flexible display substrate 210 in the X-axis direction, and the third curvature variation unit 240 may be disposed on a lower portion of the rear surface of the flexible display substrate 210 in the X-axis direction.

The first curvature variation unit 220, the second curvature variation unit 230 and the third curvature variation unit 240 may be controlled in a flat mode or a curved mode.

Each of the first curvature variation unit 220, the second curvature variation unit 230 and the third curvature variation unit 240 includes a first multiple rod 122, a second multiple rod 124 and a multiple rod control box 126. The first multiple rod 122, the second multiple rod 124 and the multiple rod control box 126 in FIG. 4 are substantially the same as the first multiple rod 122, the second multiple rod 124 and the multiple rod control box 126 in FIGS. 1A, 1B, 2A and 2B. The same reference numerals will be used to refer to the same or like parts in FIG. 4 as those described in FIGS. 1A, 1B, 2A and 2B, and any further explanation concerning the above elements will be omitted.

Each of the first curvature variation unit 220, the second curvature variation unit 230 and the third curvature variation unit 240 may be synchronized with each other to control the flexible display substrate 210 in a flat mode or a curved mode. When the first curvature variation unit 220, the second curvature variation unit 230 and the third curvature variation unit 240 is synchronized with each other, the flexible display substrate 210 may be varied to have a substantially equal curvature.

Alternatively, each of the first curvature variation unit 220, the second curvature variation unit 230 and the third curvature variation unit 240 may be asynchronized with each other to control the flexible display substrate 210 in a flat mode or a curved mode. When the first curvature variation unit 220, the second curvature variation unit 230 and the third curvature variation unit 240 is asynchronized with each other, the flexible display substrate 210 may be varied to have curvatures different to each other. In the illustrated exemplary embodiment, the flexible display substrate 210 may be curved, so that a curvature of an upper portion of the flexible display substrate 210 is greater than a curvature of a lower portion of the flexible display substrate 210.

In the exemplary embodiment of FIG. 4, it is described that three curvature variation devices are disposed so that a flexible display substrate is varied from a flat mode to a curved mode or from a curved mode to a flat mode. However, the number of curvature variation device is not limited to that exemplary embodiment.

Figure 5:
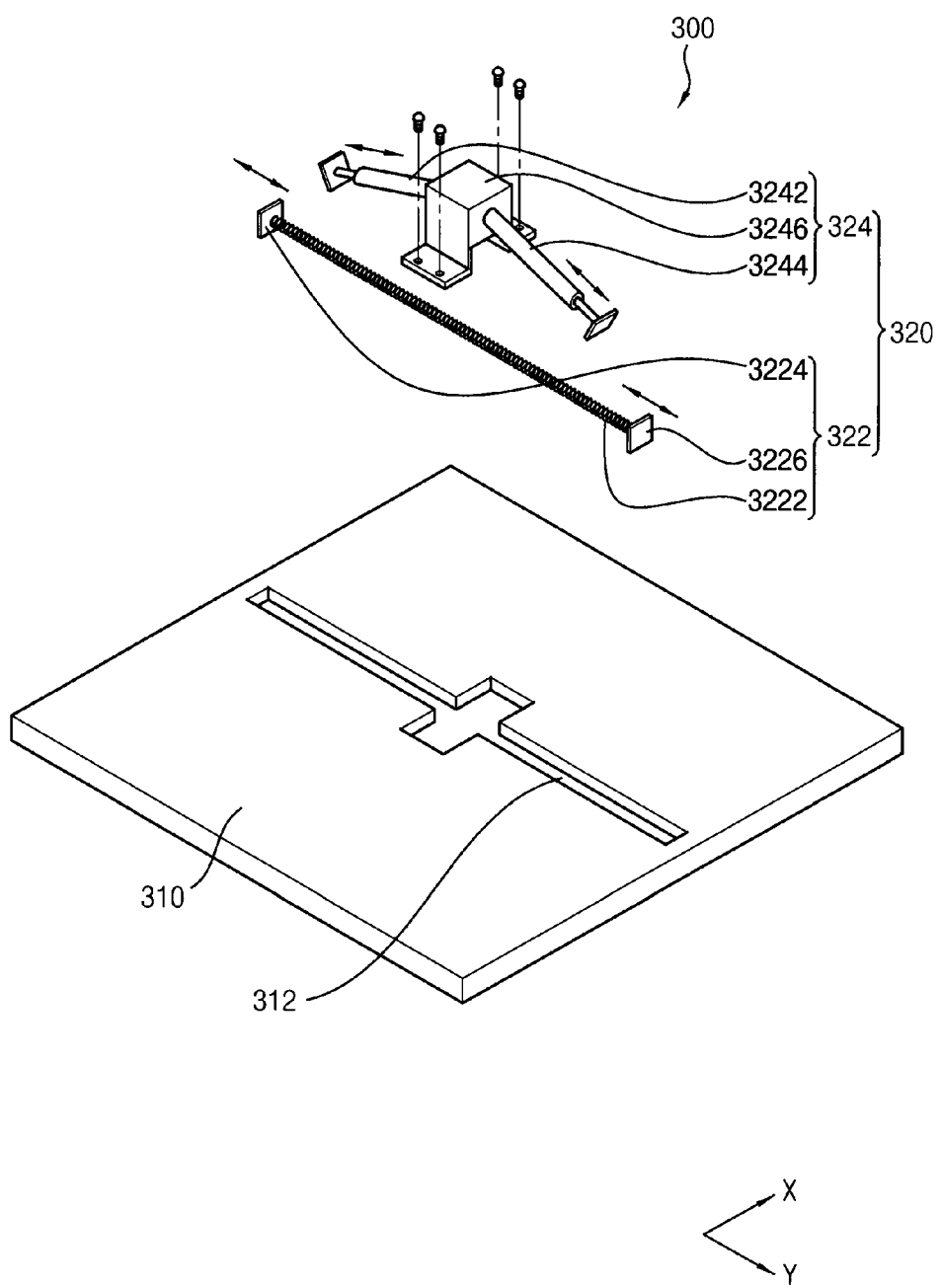
FIG. 5 is an exemplary embodiment of an exploded perspective view of the display device shown in FIGS. 1A and 1B.

FIG. 5 is an exemplary embodiment of an exploded perspective view schematically showing the display device shown in FIGS. 1A and 1B. Particularly, it is shown that a guide recess is defined on a rear surface of a flexible display substrate and a spring is included in a substrate contact member.

Referring to FIG. 5, a display device 300 includes a flexible display substrate 310 and a curvature variation device 320.

The flexible display substrate 310 may include a driving circuit region and an image (display) region. One or more thin-film transistors ("TFTs") may be disposed on the driving circuit region and the image region, respectively. In particular, the flexible display substrate 310 includes a flexible metal thin film such as stainless steel ("SUS") and/or titanium (Ti). Plural TFTs are disposed on the image region, and plural TFTs are disposed on the driving circuit region defined on the flexible display substrate 310. Each of the TFTs includes a semiconductor layer (not shown) disposed on a base (flexible) substrate, a gate electrode (not shown) disposed on the semiconductor layer, and source electrodes and drain electrodes. The semiconductor layer includes a low temperature polysilicon layer, in particular, germanium (Ge) and/or a Ge compound. Source and drain regions (not shown) electrically connected to the source and drain electrodes and channel regions disposed under gate electrodes are defined in the semiconductor layer. The channel regions of the TFTs have length and width.

In an exemplary embodiment, one or more OLEDs (not shown) electrically connected to the TFT is disposed on the image region. In another exemplary embodiment, a liquid crystal display element (not shown) electrically connected to the TFT may be disposed on the image region instead of the OLEDs.

Moreover, the flexible display substrate 310 may be an electrophoretic display device. The electrophoretic display device may include an ink substrate having an ink layer disposed on a flexible base substrate, and a driving substrate having plural thin-film transistors disposed thereon. The electrophoretic display device may be manufactured by laminating the ink substrate on the driving substrate.

In the illustrated exemplary embodiment, a guide recess 312 is defined on a rear surface of the flexible display substrate 310 and extends parallel with a Y-axis.

The curvature variation device 320 includes a substrate contact member 322 and a length variation member 324, each disposed on a rear surface of the flexible display substrate 310. A length of the curvature variation device 320 is varied in response to an operation of a user, thereby varying a curvature of the flexible display substrate 310.

The substrate contact member 322 includes a spring 3222, a first end portion 3224 connected to a first end of the spring 3222 and a second end portion 3226 connected to a second end of the spring 3222. The substrate contact member 322 is received on a rear surface of the flexible display substrate 310 so that a length of the substrate contact member 322 is variable.

The length variation member 324 includes a first multiple rod 3242, a second multiple rod 3244 and a multiple rod control box 3246, and is supported by the substrate contact member 322. A length of the length variation member 324 is varied in response to an operation of a user, thereby varying a curvature of the flexible display substrate 310.

Portions of the multiple rod control box 3246 and the spring 3222 may be received in the guide recess 312. The substrate contact member 322 may travel along a length of the guide recess 312 to vary the length of the substrate contact member 322.

The first multiple rod 3242 is connected such as at a distal end thereof, to the first end portion 3224, so that a length of the first multiple rod 3242 is varied by the multiple rod control box 3246.

The second multiple rod 3244 is connected such as at a distal end thereof, to the second end portion 3226, so that a length of the second multiple rod 3244 is varied by the multiple rod control box 3246.

The multiple rod control box 3246 is coupled to a rear surface of the flexible display substrate 310 such as through plural screws. The multiple rod control box 3246 is respectively connected to the first multiple rod 3242 and the second multiple rod 3244, so that the multiple rod control box 3246 controls a length variation of the first multiple rod 3242 and a length variation of the second multiple rod 3244.

In the illustrated exemplary embodiment, in a YZ-plane, the first multiple rod 3242 defines a first hypotenuse of a triangle, the second multiple rod 3244 defines a second hypotenuse of a triangle. The multiple rod control box 3246 is disposed at a vertical side common to both triangles and at which the first hypotenuse and the second hypotenuse meet each other.

When the first multiple rod 3242 and the second multiple rod 3244 are adjusted to have a relatively short length, an overall length of the spring 3222 of the substrate contact member 322 is relatively short. Thus, the flexible display substrate 310 may maintain a flat status or state.

When the first multiple rod 3242 and/or the second multiple rod 3244 are adjusted to have a relatively long length (or a length greater than that in the flat status), a length of the spring 3222 of the substrate contact member 322 is relatively long (e.g., longer than that in the flat status). Thus, the flexible display substrate 310 may be curved to have a concave shape in the Y-Z plane.

As described above, according to the illustrated exemplary embodiment, a substrate contact member is disposed in a guide recess of a flexible display substrate and a length variation member supported by the substrate contact member is disposed thereon. The substrate contact member includes a spring. The spring is adjacent to a rear surface of a flexible display substrate so that a length of the spring is variable. Thus, a length of multiple rods of the length variation member is varied, thereby varying a curvature of a flexible display substrate.

Figure 6:
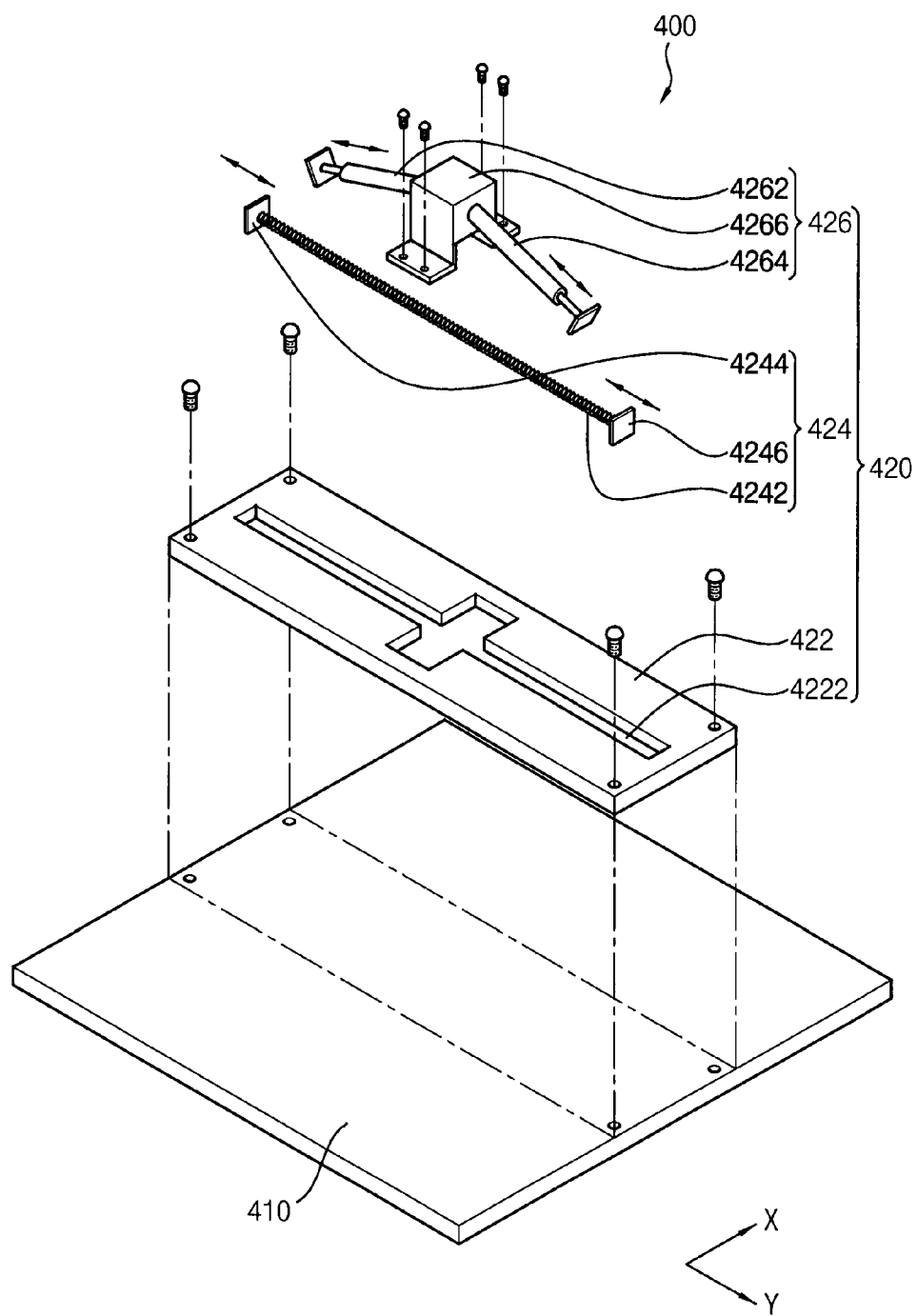
FIG. 6 is another exemplary embodiment of an exploded perspective view of the display device shown in FIGS. 1A and 1B.
Figure 7A:
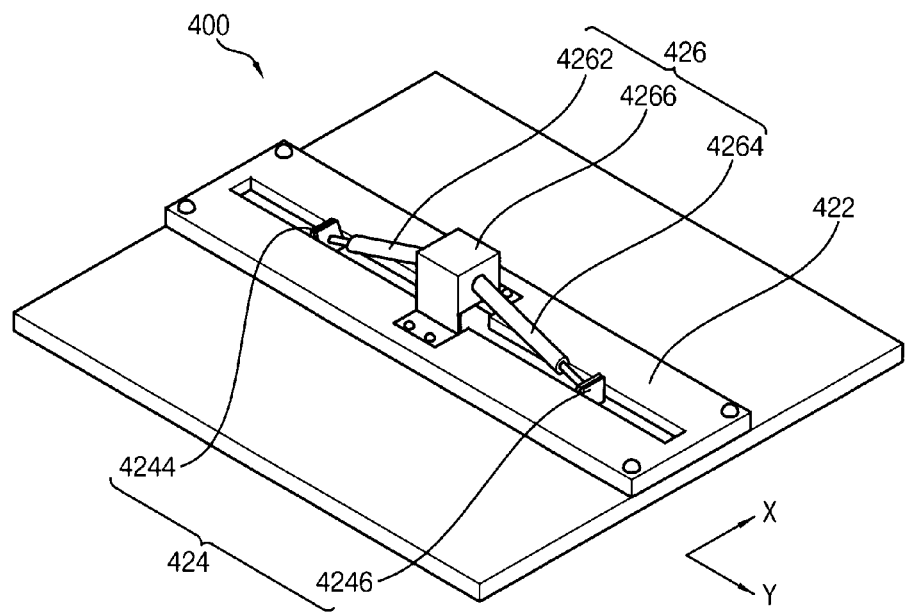
FIG. 7A is a rear perspective view schematically showing the display device of FIG. 6 realized in a flat mode.
Figure 7B:
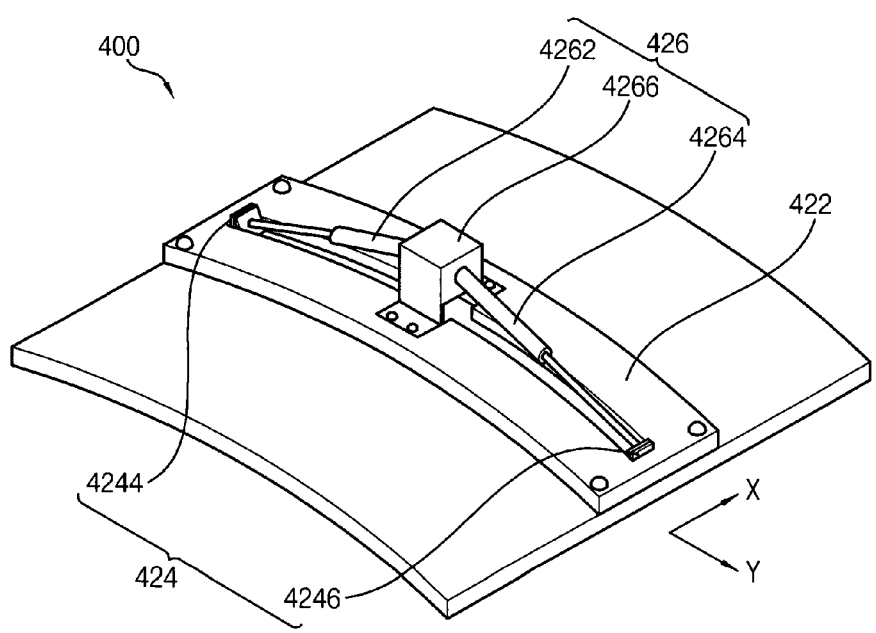
FIG. 7B is a rear perspective view schematically showing the display device of FIG. 6 realized in a curved mode.

FIG. 6 is another exemplary embodiment of an exploded perspective view schematically showing the display device shown in FIGS. 1A and 1B. FIG. 7A is a rear perspective view schematically showing the display device shown in FIG. 6 realized in a flat mode. FIG. 7B is a rear perspective view schematically showing the display device shown in FIG. 6 realized in a curved mode. Particularly, it is described that an additional rail is attached to a rear surface of a flexible display substrate and a spring is included in a substrate contact member.

Referring to FIGS. 6, 7A and 7B, a display device 400 includes a flexible display substrate 410 and a curvature variation device 420.

The flexible display substrate 410 is substantially the same as the flexible display substrate 310 of FIG. 5 except that a guide recess is not defined in a rear surface of the flexible display substrate 410. Thus, identical reference numerals are used in FIGS. 6, 7A and 7B to refer to components that are the same or like those shown in FIG. 5, and thus, a detailed description thereof will be omitted.

The curvature variation device 420 includes a substrate contact member 424 and a length variation member 426. A length of the curvature variation device 420 is varied in response to an operation of a user, so that the curvature variation device 420 may vary a curvature of the flexible display device 410.

The rail 422 is coupled to a rear surface of the flexible display substrate 410 and contacts the rear surface of the flexible display substrate 410. A guide recess 4222 for receiving the substrate contact member 424 is defined in the rail 422. The guide recess 4222 may extend partially into the rail 422, may extend completely through a thickness of the rail 422, or may extend partially into and completely through the thickness of the rail 422 at different portions of the rail 422.

The substrate contact member 424 includes a spring 4242, a first end portion 4244 connected to a first end of the spring 4242 and a second end portion 4246 connected to a second end of the spring 4242. The substrate contact member 424 is received on and/or in the guide recess 4222 defined in the rail 422 so that a length of the substrate contact member 424 is variable The length variation member 426 includes a first multiple rod 4262, a second multiple rod 4264 and a multiple rod control box 4266 and is supported by the substrate contact member 424. A length of the length variation member 426 is varied in response to an operation of a user, thereby varying a curvature of the flexible display substrate 410.

The first multiple rod 4262 is connected such as at a distal end thereof, to the first end portion 4244. A length of the first multiple rod 4262 is varied by the multiple rod control box 4266.

The second multiple rod 4264 is connected such as at a distal end thereof, to the second end portion 4246. A length of the second multiple rod 4264 is varied by the multiple rod control box 4266.

The multiple rod control box 4266 is coupled to a rear surface of the flexible display substrate 410 through plural screws. The multiple rod control box 4266 is respectively connected to the first multiple rod 4262 and the second multiple rod 4264, so that the multiple rod control box 4266 controls a length variation of the first multiple rod 4262 and a length variation of the second multiple rod 4264. The multiple rod control box 4266 may be coupled to the rear surface of the flexible display substrate 410 via the rail 422, or may extend through the guide recess 4222 to be coupled to the flexible display substrate 410.

In the illustrated exemplary embodiment, in an YZ-plane, the first multiple rod 4262 defines a first hypotenuse of a triangle, the second multiple rod 4264 defines a second hypotenuse of a triangle. The multiple rod control box 4266 is disposed at a vertical side common to both triangles and at which the first hypotenuse and the second hypotenuse meet each other.

When the first multiple rod 4262 and the second multiple rod 4264 are adjusted to have a relatively short length, an overall length of the spring 4242 of the substrate contact member 424 is relatively short. Thus, the flexible display substrate 410 may maintain a flat status.

When the first multiple rod 4262 and/or the second multiple rod 4264 are adjusted to have a relatively long length (or a length greater than that in the flat status), a length of the spring 4242 of the substrate contact member 424 is relatively longer (e.g., longer than that in the flat status). Thus, the flexible display substrate 410 may be curved to have a concave shape in the Y-Z plane.

As described above, according to the illustrated exemplary embodiment, a rail having a guide recess defined therein is disposed on a rear surface of a flexible display substrate, a substrate contact member is disposed in the guide recess, and a length variation member supported by the substrate contact member is disposed thereon. The substrate contact member includes a spring. The spring is adjacent to a rear surface of a flexible display substrate so that a length of the spring is variable. Thus, lengths of multiple rods of the length variation member are varied, thereby varying a curvature of a flexible display substrate.

Figure 8:
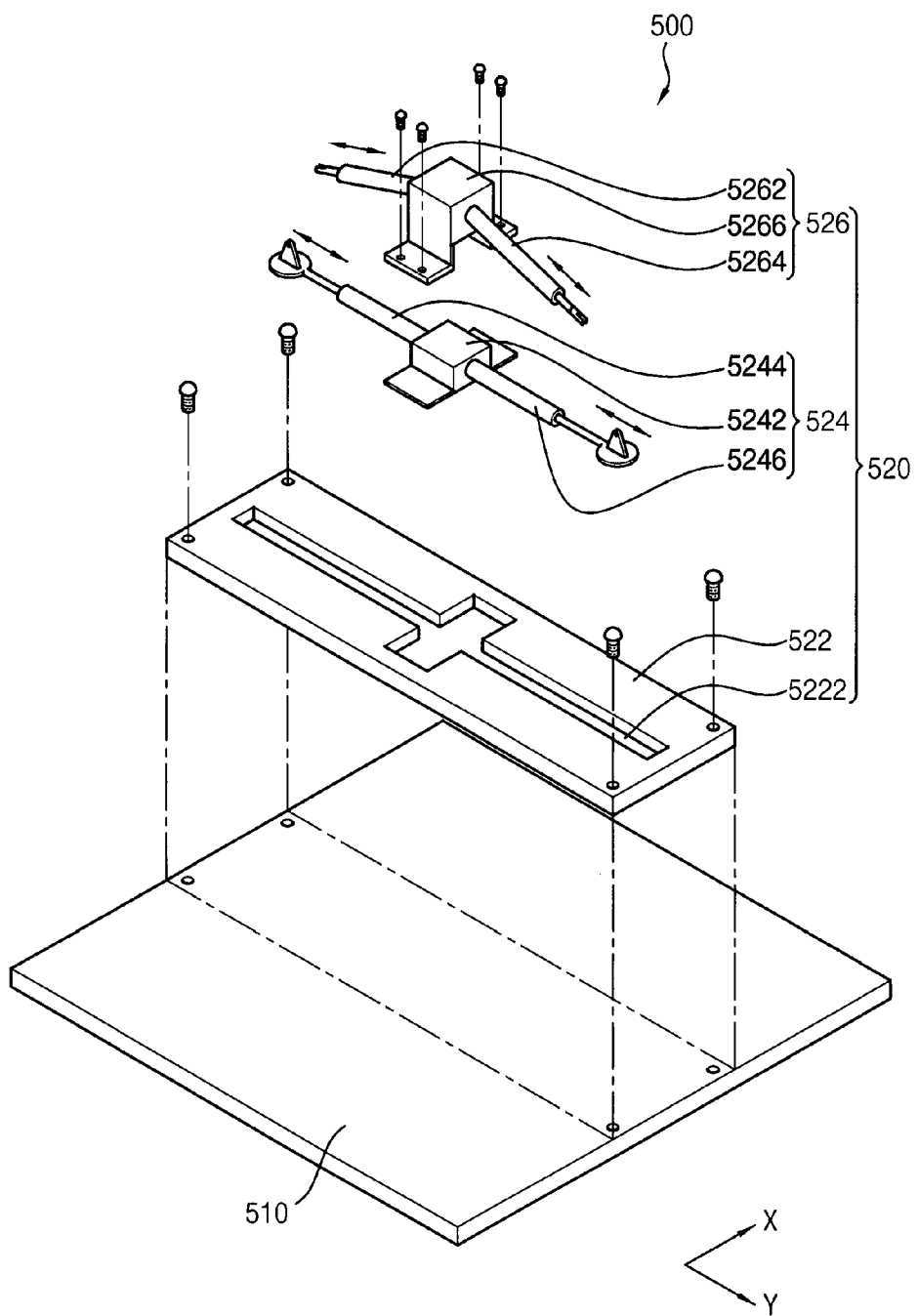
FIG. 8 is still another exemplary embodiment of an exploded perspective view of the display device shown in FIGS. 1A and 1B.
Figure 9:
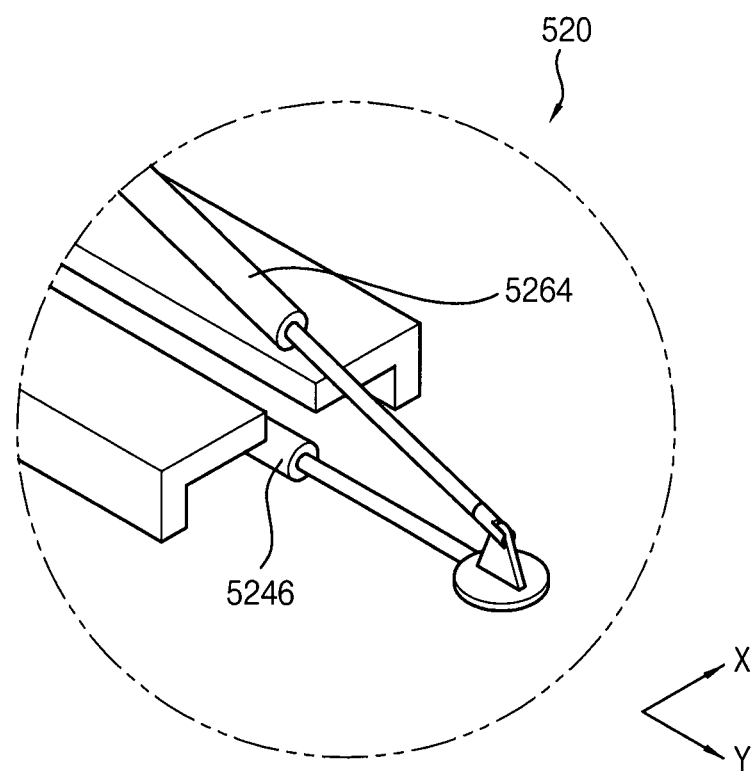
FIG. 9 is an exploded perspective view schematically showing an exemplary embodiment of a portion of the rail, a portion of the substrate contact member and a portion of the length variation member shown in FIG. 8.

FIG. 8 is an exploded perspective view schematically showing still another exemplary embodiment of the display device shown in FIGS. 1A and 1B. FIG. 9 is an exploded perspective view schematically showing an exemplary embodiment of a portion of the rail, a portion of the substrate contact member and a portion of the length variation member shown in FIG. 8.

Referring to FIGS. 8 and 9, a display device 500 includes a flexible display substrate 510 and a curvature variation device 520.

The flexible display substrate 510 is substantially the same as the flexible display substrate 410 of FIG. 6, and thus any repetitive detailed explanation may hereinafter be omitted.

The curvature variation device 520 includes a rail 522, a substrate contact member 524 and a length variation member 526. A length of the curvature variation device 520 is varied in response to an operation of a user, so that the curvature variation device 520 may vary a curvature of the flexible display device 510.

The rail 522 is coupled to and contacts a rear surface of the flexible display substrate 510. A guide recess 5222 for receiving the substrate contact member 524 is defined in the rail 522.

The substrate contact member 524 includes a first stopper 5244, a second stopper 5246 and a stopper control box 5242. The substrate contact member 524 is received in the guide recess 5222 defined in the rail 522, so that a length of the substrate contact member 524 may be variable.

The first stopper 5244 is received in the guide recess 5222 defined in the rail 522. A length of the first stopper 5244 is varied by the stopper control box 5266.

The second stopper 5246 is received in the guide recess 5222. A length of the second stopper 5246 is varied by the stopper control box 5266.

The stopper control box 5242 is coupled to a rear surface of the flexible display substrate 510 through plural screws. The stopper control box 5242 is respectively connected to the first stopper 5244 and the second stopper 5246, so that the stopper control box 5242 controls a length variation of the first stopper 5244 and a length variation of the second stopper 5246.

Each of the first stopper 5244 and the second stopper 5246 may include a penetration wire WIP, and a core wire WIC inserted into the penetration wire WIP as shown in FIGS. 10A, 10B, 11A and 11B which will be described later.

Figure 10A:
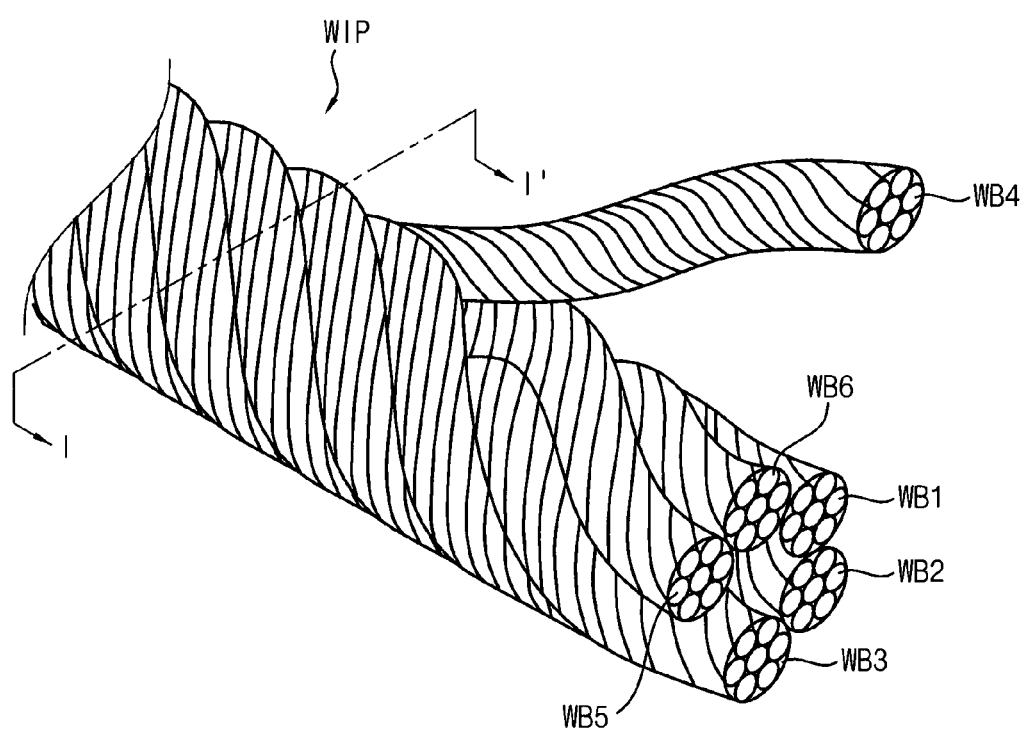
FIG. 10A is a perspective view schematically showing an exemplary embodiment of a penetration wire.
Figure 10B:
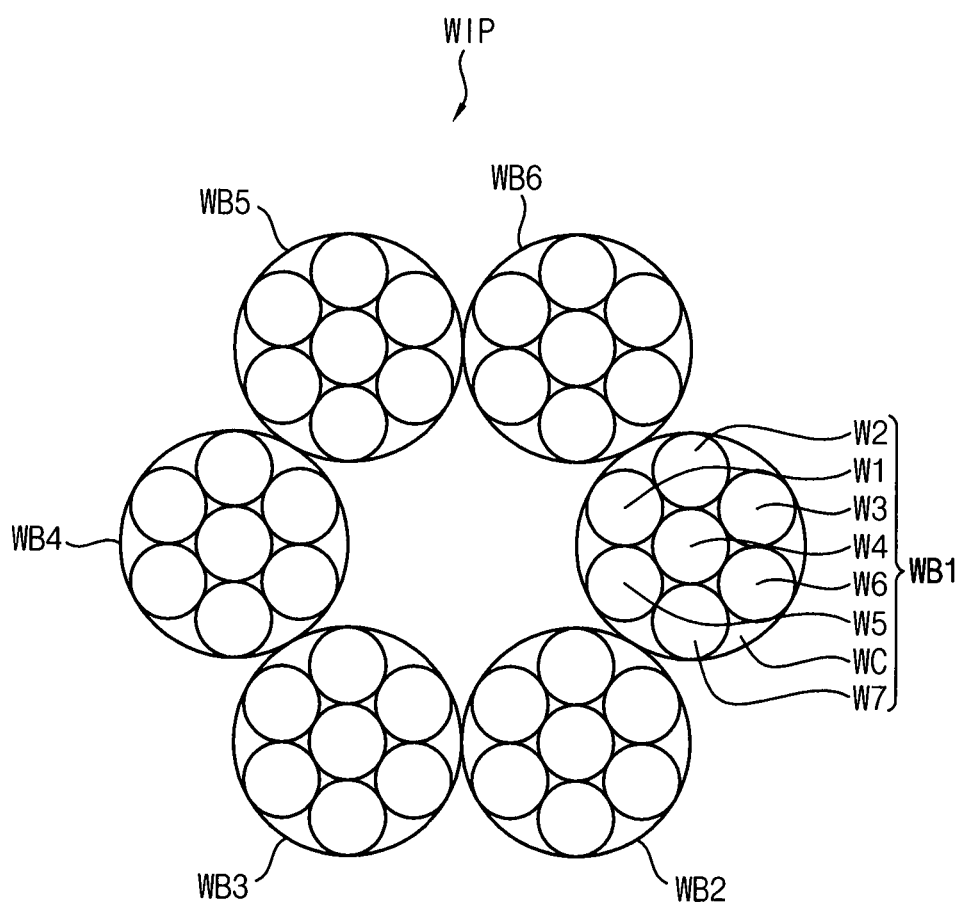
FIG. 10B is a cross-sectional view taken along line I-I' of FIG. 10A.
Figure 11A:
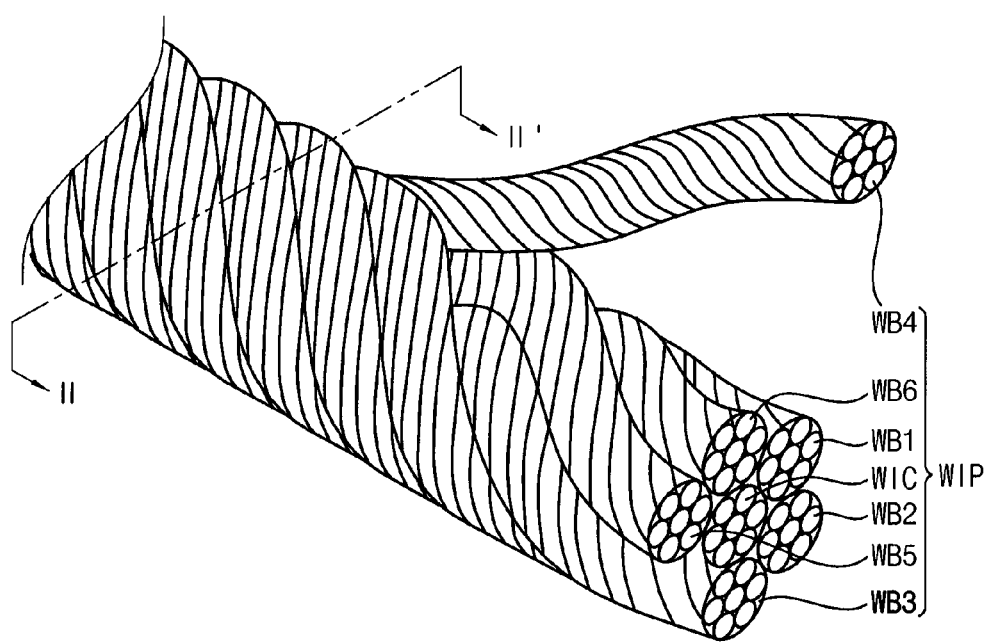
FIG. 11A is a perspective view schematically showing an exemplary embodiment of a stopper including a core wire, and a penetration wire inserted into the core wire.
Figure 11B:
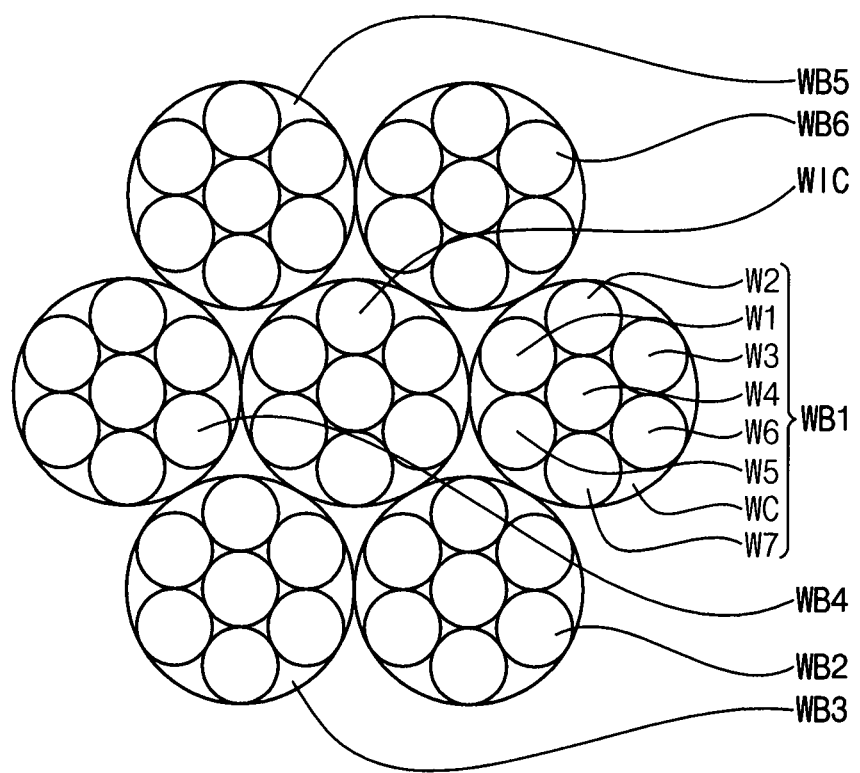
FIG. 11B is a cross-sectional view taken along line II-II' of FIG. 11A.

FIG. 10A is a perspective view schematically showing an exemplary embodiment of a penetration wire. FIG. 10B is a cross-sectional view taken along line I-I' of FIG. 10A. FIG. 11A is a perspective view schematically showing a stopper having a core wire and a penetration wire inserted into the core wire. FIG. 11B is a cross-sectional view taken along line II-II' of FIG. 11A.

Referring to FIGS. 10A, 10B, 11A and 11B, a penetration wire WIP includes plural wire bundles WB1, WB2, WB3, WB4, WB5 and WB6 interlaced to define a (penetrated) inner space. One wire bundle includes plural wires W1, W2, W3, W4, W5, W6 and W7 and a wire cover WC surrounding the plural wires W1, W2, W3, W4, W5, W6 and W7.

The penetration wire WIP may be manufactured by the following process.

In an exemplary embodiment of manufacturing the penetration wire WIP plural wire bundles WB1, WB2, WB3, WB4, WB5 and WB6 are wound around a round bar (not shown), the round bar being at a center of the plural wire bundles WB1, WB2, WB3, WB4, WB5 and WB6, and then the plural wire bundles WB1, WB2, WB3, WB4, WB5 and WB6 are twisted about the round bar uniformly. Then, the round bar is separated from the twisted plural wire bundles WB1, WB2, WB3, WB4, WB5 and WB6 to form a pipe type penetration wire having an empty interior defined therein. A portion of the pipe type penetration wire is separated from a remaining portion thereof, such as by cutting, to complete a penetration wire WIP.

The core wire WIC includes plural wires W1, W2, W3, W4, W5, W6 and W7, and a wire cover WC surrounding the wires W1, W2, W3, W4, W5, W6 and W7. The core wire WIC is received in an inner space of the penetration wire WIP. A diameter of the core wire WIC is smaller than each diameter of wire bundles WB1, WB2, WB3, WB4, WB5 and WB6 of the penetration wire WIP. Accordingly, a length of the core wire WIC received in an interior of the penetration wire WIP is variable by an external force.

Referring again to FIGS. 8 and 9, the length variation member 526 includes a first multiple rod 5262, a second multiple rod 5264 and a multiple rod control box 5266 and is supported by the substrate contact member 524. A length of the length variation member 526 is varied in response to an operation of a user, thereby varying a curvature of the flexible display substrate 510.

The first multiple rod 5262 is connected such as at a distal end thereof, to the first stopper 5244. A length of the first multiple rod 5262 is varied by the multiple rod control box 5266.

The second multiple rod 5264 is connected such as at a distal end thereof, to the second stopper 5246. A length of the second multiple rod 5264 is varied by the multiple rod control box 5266.

The multiple rod control box 5266 is coupled to a rear surface of the flexible display substrate 510 by plural screws. The multiple rod control box 5266 is respectively connected to the first multiple rod 5262 and the second multiple rod 5264, so that the multiple rod control box 5266 controls a length variation of the first multiple rod 5262 and a length variation of the second multiple rod 5264.

In the illustrated exemplary embodiment, in a YZ-plane, the first multiple rod 5262 defines a first hypotenuse of a triangle, the second multiple rod 5264 defines a second hypotenuse of a triangle. The multiple rod control box 5266 is disposed at a vertical side common to both triangles and at which the first hypotenuse and the second hypotenuse meet each other.

When the first multiple rod 5262 and the second multiple rod 5264 are adjusted to have a relatively short length, an overall a length of the spring 5242 of the substrate contact member 524 is relatively short. Thus, the flexible display substrate 510 may maintain a flat status.

When the first multiple rod 5262 and/or the second multiple rod 5264 are adjusted to have a relatively long length (or a length greater than that in the flat status), a length of the spring 5242 of the substrate contact member 524 is relatively long (e.g., longer than that in the flat status. Thus, the flexible display substrate 510 may be curved to have a concave shape.

As described above, according to one or more exemplary embodiment, a rail having a guide recess defined therein is disposed on a rear surface of a flexible display substrate, a substrate contact member is disposed in the guide recess, and a length variation member supported by the substrate contact member is disposed thereon. The substrate contact member includes a plurality of stoppers each including a penetration wire and a core wire. The stoppers are adjacent to a rear surface of a flexible display substrate so that lengths of the stoppers are variable. Thus, lengths of multiple rods of the length variation member are varied, thereby varying a curvature of a flexible display substrate.

Having described exemplary embodiments of the invention, it is further noted that it is readily apparent to those of reasonable skill in the art that various modifications may be made without departing from the spirit and scope of the invention which is defined by the metes and bounds of the appended claims.

What is claimed is:

1. A display device comprising:
   a flexible display substrate; and
   a curvature variation device on a rear surface of the flexible display substrate, comprising:
      a substrate contact member which is received in a guide recess at the rear surface of the flexible display substrate and contacts the rear surface of the flexible display substrate; and
      a length variation member supported by the substrate contact member,
   wherein
   a length of the length variation member is configured to be varied in response to user input to the curvature variation device,
   variation of the length of the length variation member in response to the user input to the curvature variation device varies a length of the substrate contact member in the guide recess at the rear surface of the flexible display substrate, and
   variation of the length of the substrate contact member in the guide recess at the rear surface of the flexible display substrate varies a curvature of the flexible display substrate.

2. The display device of claim 1, wherein
   the guide recess is defined in the rear surface of the flexible display substrate, and
   the
   substrate contact member is received in the guide recess defined in the rear surface of the flexible display substrate.

3. The display device of claim 1, wherein the curvature variation device comprises:
   a rail contacting the rear surface of the flexible display substrate, and in which a guide recess is defined, and
   the substrate contact member is received in the guide recess defined in the rail.

4. The display device of claim 1, wherein the curvature variation device is parallel with a surface of the flexible display substrate.

5. The display device of claim 1, wherein the curvature of the flexible display substrate defines a flat state or a curved state of the flexible display substrate.

6. The display device of claim 1, wherein the curvature of the flexible display substrate is symmetrically varied by the curvature variation device with respect to a position of the curvature variation device.

7. The display device of claim 1, wherein the curvature of the flexible display substrate is asymmetrically varied by the curvature variation device with respect to a position of the curvature variation device.

8. A curvature variation device to vary a curvature of a flexible display substrate in response to an operation of a user, the curvature variation device comprising:
   a substrate contact member on a rear surface of the flexible display substrate, received in a guide recess defined in the rear surface of the flexible display substrate and contacting the rear surface of the flexible display substrate; and
   a length variation member supported by the substrate contact member, wherein
a length of the length variation member is configured to be varied in response to the operation of the user to the curvature variation device, and
variation of the length of the length variation member varies the curvature of the flexible display substrate.

9. The curvature variation device of claim 8, wherein the substrate contact member comprises a spring.

10. A curvature variation device to vary a curvature of a flexible display substrate in response to an operation of a user, the curvature variation device comprising:
a rail on and contacting a rear surface of the flexible display substrate, and a guide recess defined in the rail;
a substrate contact member received in the guide recess defined in the rail and contacting the rear surface of the flexible display substrate; and
a length variation member supported by the substrate contact member,
wherein
a length of the length variation member is configured to be varied in response to the operation of the user to the curvature variation device,
variation of the length of the length variation member varies a length of the substrate contact member received in the guide recess defined in the rail, and
variation of the length of the substrate contact member received in the guide recess defined in the rail varies the curvature of the flexible display substrate.

11. The curvature variation device of claim 10, wherein the substrate contact member comprises:
a first stopper received in the guide recess defined in the rail and of which a length is variable along a first end of the rail;
a second stopper received in the guide recess defined in the rail and of which a length is variable along a second end of the rail opposite to the first end; and
a stopper control box which is respectively connected to the first stopper and the second stopper and controls a length variation of the first stopper and a length variation of the second stopper.

12. The curvature variation device of claim 11, wherein each of the first stopper and the second stopper comprises:
a penetration wire comprising plural wire bundles interlaced with each other to form a penetrated inner space; and
a core wire comprising a single wire bundle and received in the penetrated inner space of the penetration wire.

13. The curvature variation device of claim 11, wherein the length variation member comprises:
a first multiple rod connected to an end portion of the first stopper;
a second multiple rod connected to an end portion of the second stopper; and
a multiple rod control box which is respectively connected to the first multiple rod and the second multiple rod, and controls a length variation of the first multiple rod and a length variation of the second multiple rod.

* * * * *